(12) United States Patent
Johnson

(10) Patent No.: US 6,424,207 B1
(45) Date of Patent: Jul. 23, 2002

(54) PWM ACTIVE FILTER FOR DC POWER SYSTEMS

(75) Inventor: Robert D. Johnson, Timonium, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/837,052

(22) Filed: Apr. 18, 2001

(51) Int. Cl.[7] .............................. H03B 1/00; H03K 5/00; H04B 1/00
(52) U.S. Cl. ...................................................... 327/552
(58) Field of Search ................................. 327/552–559

(56) References Cited

U.S. PATENT DOCUMENTS 5,384,696 A * 1/1995 Moran et al. ............... 323/207
5,751,138 A * 5/1998 Venkata et al. ............. 323/207

* cited by examiner

Primary Examiner—Terry D. Cunningham
Assistant Examiner—Quan Tra

(57) ABSTRACT

An active filter circuit for filtering unwanted AC voltages and currents from a DC power system, and including a power circuit and a control circuit. The power circuit consists of two semiconductor power transistors, respective anti-parallel diodes, an inductor and at least one capacitor. The control circuit generates pulse width modulated (PWM) control signals for operating the transistors such that when one transistor is conducting, the other transistor is non-conducting, and vice versa. The filter implements an auxiliary DC voltage bus by charging the capacitor which acts as a reservoir of energy. The DC level of this auxiliary bus is controlled by controlling the DC component of the duty cycle. The AC component of the duty cycle is used to modulate the current drawn from or supplied to the DC power system so as to cancel unwanted AC voltages and currents.

18 Claims, 3 Drawing Sheets

PWM ACTIVE FILTER FOR DC POWER SYSTEMS

BACKGROUND OF THE INVENTION

1. Field of the Invention

This invention relates generally to electrical signal filters and more particularly to an active filter for controlling ripple in the load current or source current of DC power systems.

2. Description of Related Art

Various systems have been developed for controlling ripple, broadly defined as "any unwanted time-varying voltage or current", in DC power systems. Such means include passive filters, voltage and current regulators, and active filters. Each of these approaches has its advantages and disadvantages.

Passive filters are perhaps the most widely used means of controlling ripple. Such filters have low complexity and high efficiency. Passive filters, moreover, are better suited for attenuating high frequencies than low frequencies. At low frequencies, the size and weight of the passive components typically become prohibitive, particularly for mobile, airborne, and space borne systems.

Voltage and current regulators are better suited for attenuating low frequency ripple than high frequency ripple. This is due to the fact that they employ active control loops which have limited bandwidth. Voltage and current regulators may be of the linear type or the switching type. Linear regulators have lower complexity, but tend to have low efficiency. Switching regulators, on the other hand, have high efficiencies, but they are more complex and can introduce unwanted high frequency ripple while attenuating low frequency ripple. The regulation provided by voltage and current regulators is an added benefit not offered by passive or active filters.

Active filters, like voltage and current regulators, operate better at low frequencies than at high frequencies and may also be of the linear type or switching type. Active filters cancel ripple signals by injecting voltages or currents that are equal to the unwanted signals in amplitude but opposite in phase. While electronic regulators must process all of the power required by load, active filters process only the power associated with ripple that is being canceled. Consequently, active filters can utilize smaller components with lower power ratings than their regulating counterparts. In systems where regulation is not required or is provided by other means, active filters may have an advantage over voltage and current regulators in terms of cost, size, weight, and efficiency.

SUMMARY

Accordingly, it is an object of the present invention to provide an improvement in electrical filter circuitry.

It is another object of the invention to provide an improvement in filter circuits for controlling ripple in DC power systems.

It is a further object of the invention to provide an improvement in active filters for controlling ripple in DC power systems.

These and other objects are achieved by a circuit for filtering unwanted AC voltages and currents from a DC power circuit, and is comprised of a power circuit and a control circuit. The power circuit consists of two semiconductor power switches and respective anti parallel diodes, an inductor and at least one capacitor. The control circuit consists of a multi-loop feedback network that produces a duty cycle command signal and converts it to a pair of complementary pulse width modulated (PWM) drive signal for the two semiconductor power switches. The filter, operating on the principle of a bi-directional boost/buck converter, implements an auxiliary DC voltage bus which by charging the capacitor acts as a reservoir of energy. The DC level of this auxiliary bus is controlled by controlling the DC component of the duty cycle. The AC component of the duty cycle is used to modulate the current drawn from or supplied to the power system with the point of injection located between the DC source and the load. The modulated current is controlled in such a way as to cancel unwanted currents or voltages within the power system.

Further scope of applicability of the present invention will become apparent from the detailed description provided hereinafter. It should be understood, however, that the detailed description and specific example, while indicating the preferred embodiment of the invention, is provided by way of illustration only, since various changes and modifications coming within the spirit and scope of the invention will become apparent to those skilled in the art from the detailed description.

BRIEF DESCRIPTION OF THE DRAWINGS

The present invention will become more fully understood when considered in conjunction with the accompanying drawings which are provided by way of illustration only, and are thus not meant to be limitative of the invention, and wherein.

DETAILED DESCRIPTION OF THE INVENTION

Throughout this specification, DC components are represented by upper case characters, AC components by lower case italic characters, and composite signals, containing both AC and DC components, by lower case non-italic characters.

Figure 1:
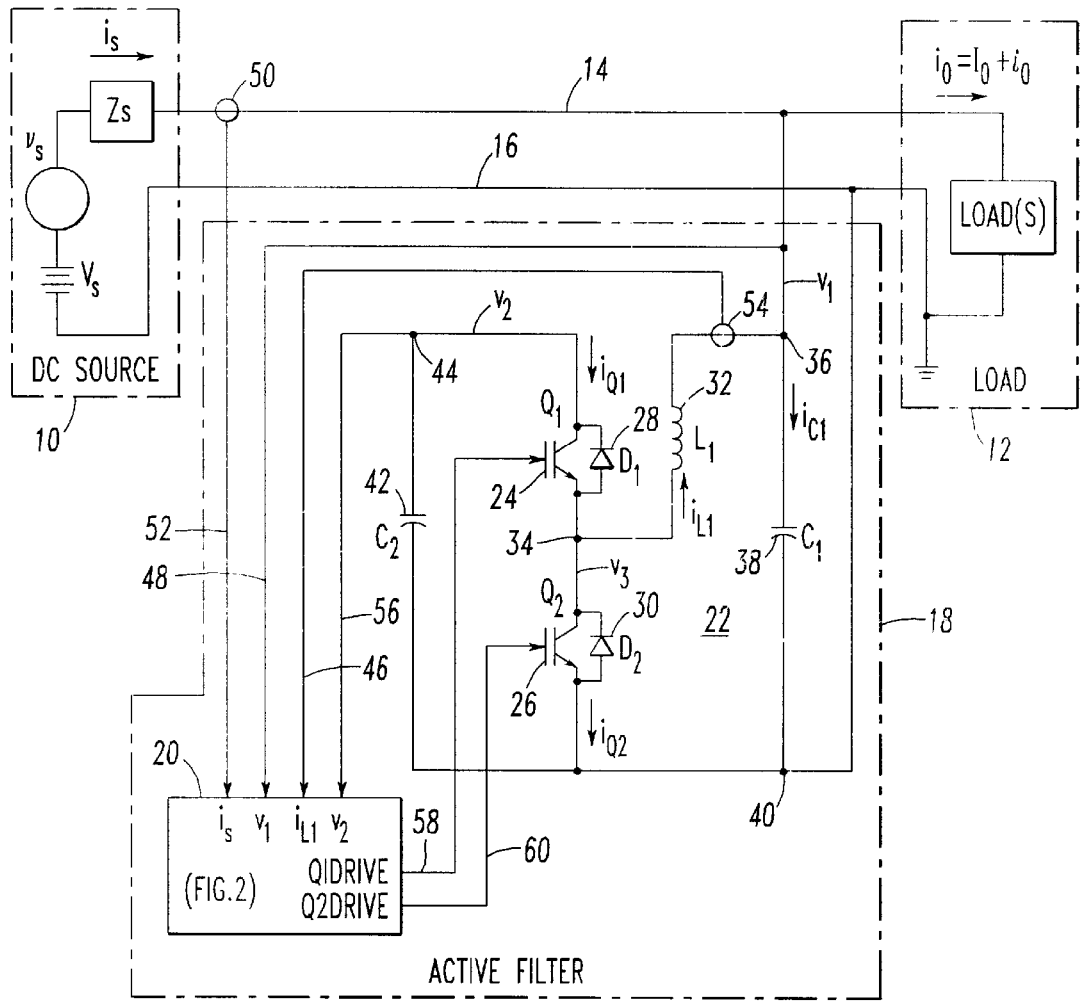
FIG. 1 is an electrical schematic diagram illustrative of an active filter in accordance with a preferred embodiment of the invention.

Referring now to the drawings wherein like reference numerals refer to like parts throughout, reference is first made to FIG. 1. As shown, reference numeral 10 denotes a DC power source comprised of, for example, conventional 3Ø AC power source, a full wave rectifier and a passive filter network, not shown. The power source 10 includes a DC component of voltage $V_s$ and an AC component of voltage $v_s$ and a DC source impedance $Z_s$. The DC source 10 is connected to one or more DC load(s) 12 via a DC power bus 14 and a return bus 16.

Further as shown, an active filter circuit 18, which is the subject of this invention, is connected across the busses 14 and 16 between the DC source 10 and the load(s) 12. The active filter 18 is shown including a control circuit 20 and a power circuit 22. The power circuit 22 is comprised of a pair of cascoded, i.e. serially connected, semiconductor power switches $Q_1$ and $Q_2$, respective anti-parallel diodes $D_1$ and $D_2$, an inductor $L_1$, and a pair of capacitors $C_1$ and $C_2$. The switches Q1 and Q2 are implemented by a pair of transistors 24 and 26. The diodes $D_1$ and $D_2$ consist of semiconductor diodes 28 and 30 having their cathode and anode electrodes connected to the collector and emitter electrodes of the $Q_1$ and $Q_2$ transistors 24 and 26. The inductor $L_1$, identified by reference numeral 32, is connected between a common connection between the emitter of $Q_1$ transistor 24 and the collector of $Q_2$ transistor 26 at node 34 while the opposite end is connected to the power bus 14 between the DC source 10 and the load 12 at circuit node 36. The first capacitor $C_1$ comprises a fixed capacitor identified by reference numeral 38, and is connected across the power bus 14 at circuit node 36 which is common to one side of the $L_1$ inductor 32 and the return bus at circuit node 40 which is also common to the emitter electrode of $Q_2$ transistor 26. The second capacitor $C_2$ comprises a fixed capacitor, identified by reference numeral 42, coupled across $Q_1$ and $Q_2$ transistors 24 and 26. Where a suitable capacitor already exists as part of the DC power system $C_1$ capacitor 38 may not be required One side of C2 capacitor 42 which is common to the collector electrode of $Q_1$ transistor 24 is connected to one input of the control circuit 20 via the circuit node 44 and circuit lead 46 for applying a voltage signal $v_2$ thereto corresponding to the voltage across the $C_2$ capacitor 42. A voltage signal $v_1$ corresponding to load voltage on the bus 14 is applied to a second input from circuit node 36 via circuit lead 48. A current signal $i_s$ corresponding to current flowing in the bus 14 from the DC source 10 is sensed by a current sensor 50 and coupled to the control circuit by a signal lead 52. A second current sensor 54 senses the current flowing in the $L_1$ inductor 32 with a signal lead 56 applying a corresponding current signal $i_{L1}$ to the fourth input of the control circuit 20.

Figure 2:
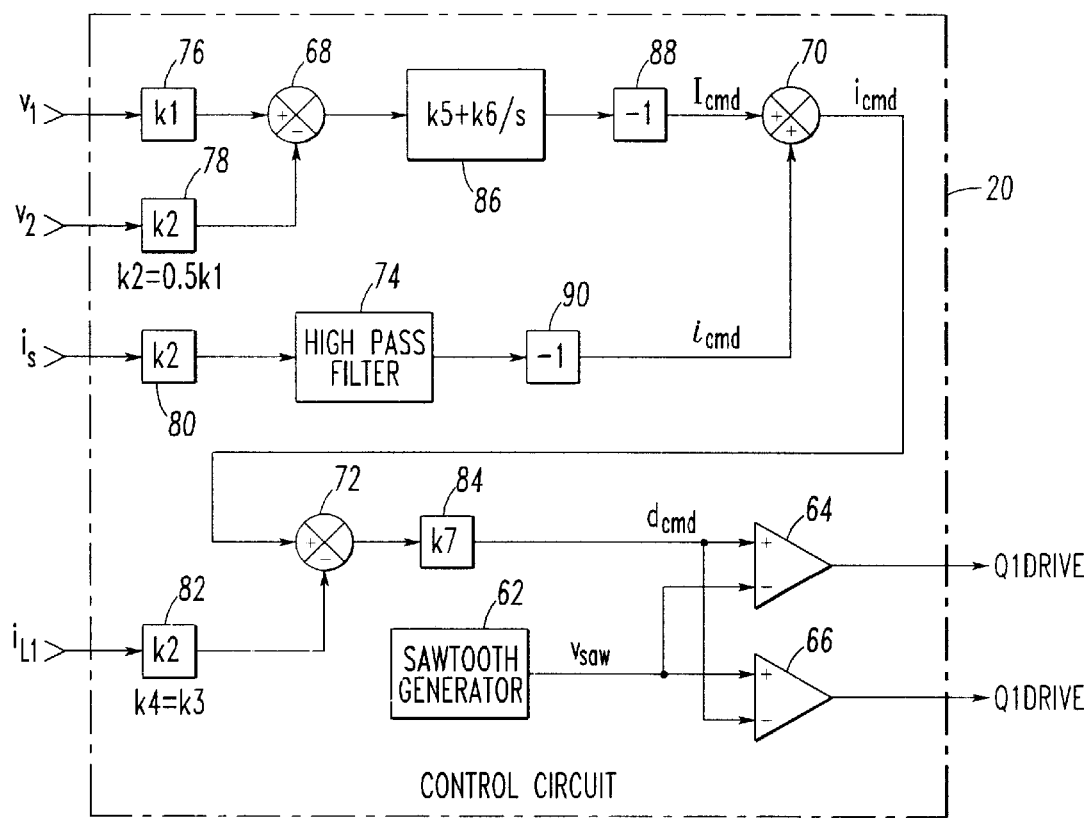
FIG. 2 is an electrical block diagram illustrative of the control circuit utilized in the embodiment shown in FIG. 1.
Figure 3:
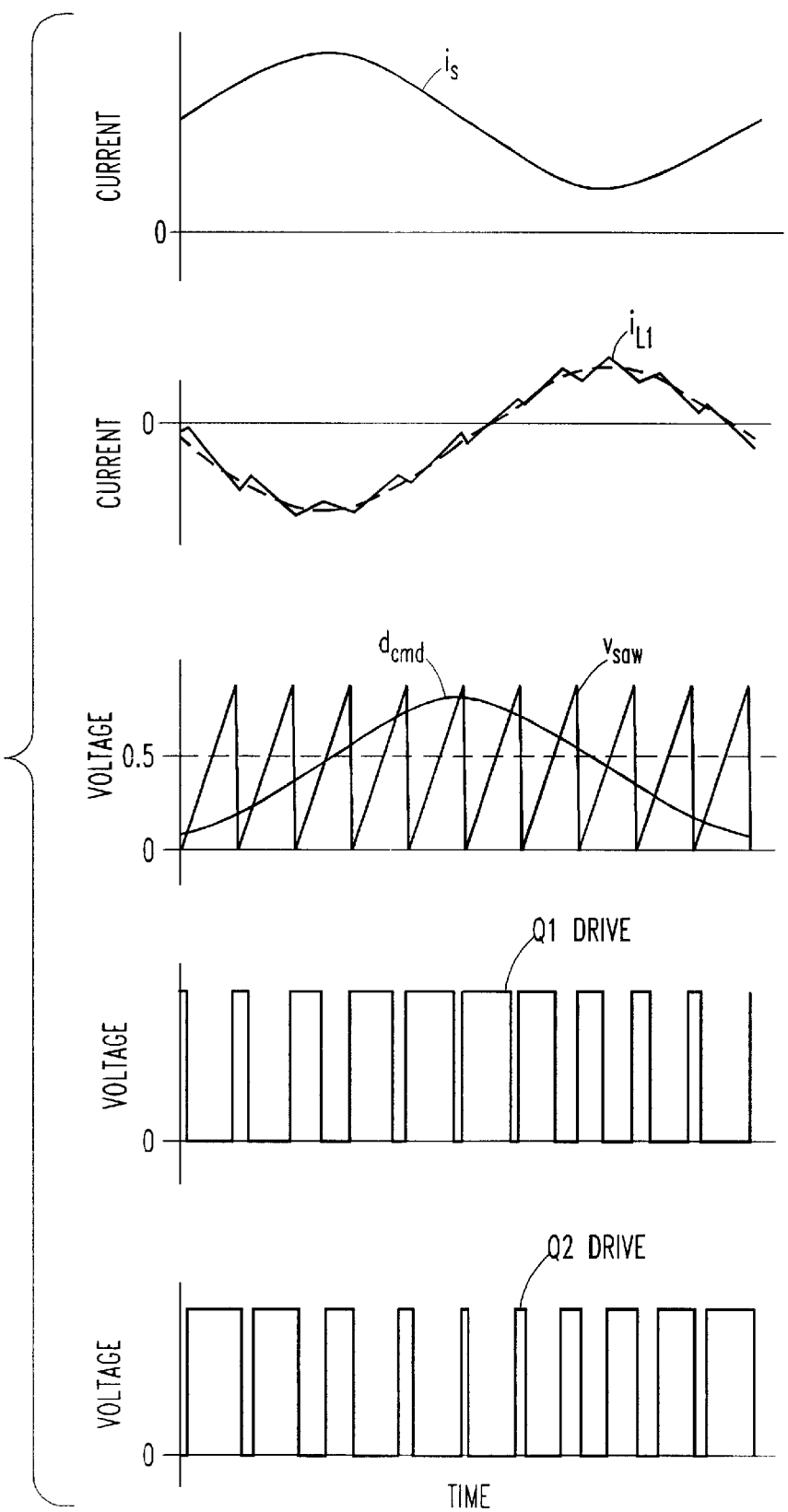
FIG. 3 is a first set of time related waveforms helpful in understanding the operation of the invention.

The control circuit 20, the details of which are shown in FIG. 2, generates and outputs two control signals Q1drive and Q2drive, depicted in FIG. 3, which are coupled to the gate electrodes of $Q_1$ and $Q_2$ insulated gate bipolar transistors (IGBT) 24 and 26 via circuit leads 58 and 60 (FIG. 1) for controlling their conductivity. When the semiconductor transistor switches $Q_1$ and $Q_2$ are properly controlled, power circuit 22 generates an arbitrarily shaped AC current waveform $i_{L1}$ as shown in FIG. 3 in the inductor $L_1$, which is injected into the power bus 14. Moreover, this injected current can be controlled to cancel unwanted currents and voltages within the power system represented in FIG. 3 as the AC component of $i_s$.

The principal components of the control circuit 20 includes a sawtooth generator 62 and a pair of voltage comparators 64 and 66 which generate the output signals Q1drive and Q2drive in response to the two voltage signals $v_1$ and $v_2$ present at circuit nodes 36 and 44, and two current signals $i_s$ and $i_{L1}$ generated by the current sensors 50 and 54 shown in FIG. 1. As shown in FIG. 2, the control circuit 20 additionally includes two error detectors 68 and 72, a summing network 70, a high pass filter 74, two circuit elements 88 and 90 which implement constant gain transfer functions of –1, five circuit elements 76, 78, 80, 82 and 84, which implement gain transfer functions of k1, k2=0.5k1, k3, k4=k3 and k7, and a well known proportional-plus-integral gain circuit element 86 which implement the transfer function k5+k6/s.

As shown, the voltage signals $v_1$ and $v_2$ are fed to the error detector 68 via the circuit elements 76 and 78, where a difference signal is generated and fed to the circuit element 86, which outputs a signal which is inverted by circuit element 88 to generate a DC current reference signal $I_{cmd}$ which is supplied to a summing network 70 which has an AC reference signal $i_{cmd}$ fed thereto via the inverting circuit element 90, which is fed by the high pass filter 74 which is coupled to the current signal $i_s$ via the gain circuit element 80. The summing network 70 outputs a current command signal $i_{cmd}$ which is fed to the second error detector 72, whose other input comprises the current signal $i_{L1}$ whose amplitude has been altered by the circuit element 82. The difference output of the error detector 72 is fed to the circuit element 84, whose output comprises a duty cycle command signal $d_{cmd}$ which is applied to the + and – inputs of comparators 64 and 66, respectively. The output of the sawtooth generator $v_{saw}$ is fed to the – and + inputs of comparators 64 and 66, respectively.

It can be seen with reference to FIG. 3 that these two signals generate pulsewidth modulated Q1drive and Q2drive output signals of mutually opposite polarity so that the two power switches, $Q_1$ transistor 24 and $Q_2$ transistor 26, are operated in complementary fashion so that when one is off, the other is on, and vice versa. A small amount of dead time ($Q_1$ and $Q_2$ both off must be allowed to prevent a shoot through condition. The shoot-through protection circuitry is not shown. During this dead time, either $D_1$ diode 28 or $D_2$ diode 30 will conduct, depending on the direction that the current $i_{L1}$ is flowing at that instant. Switching is done at a constant frequency and control is accomplished by varying duty cycle.

Figure 4:
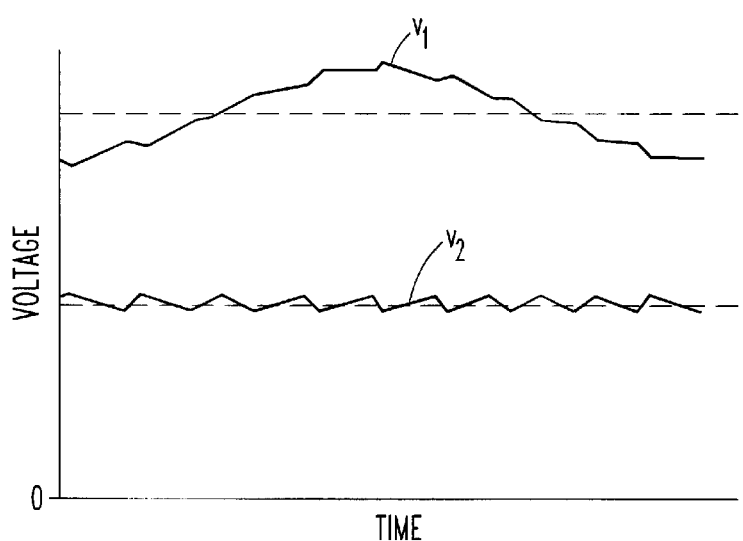
FIG. 4 is a second set of time related waveforms illustrative of the operation of the embodiment shown in FIG. 1.

Referring to the control scheme illustrated in FIG. 2, some additional details pertinent to the implementation of this control scheme should be noted. The value of scaling constant k2 of element 78 is made to equal 0.5 times the value of k1 of element 76. This choice for the ratio of k2/k1 results in the DC component $V_2$ of $v_2$ being regulated to twice the level of the DC component $V_1$ of $v_1$ as represented in FIG. 4. The value of the ratio k2/k1 is somewhat arbitrary subject to the limitation 0<k2/k1<1. For different values of k2/k1 the resulting ratio $V_1/V_2$ will vary accordingly. The value of scaling constant k4 of element 82 is made equal to the value of k3 of element 80 so as to cause the magnitude of the injected current $i_{L1}$ to be equal to the magnitude of the disturbance current $i_s$. Inverting element 90 causes the phase of the $i_{L1}$ to be opposite the phase of is thereby achieving cancellation. The purpose of high pass filter 74 is to block the DC component of $i_s$ from contributing to the AC current command signal $i_{CMD}$. Proportional-plus-integral gain element 86 determines the gain and bandwidth characteristics of the feedback loop regulating $V_2$. The gain constants k5 and k6 which constitute element 86 are chosen to make the bandwidth of this loop small compared to the frequency of the disturbance being canceled, because the regulating action of this loop tends to oppose modulation of $i_{L1}$ via the AC current command signal $i_{CMD}$. Inverting element 88 is required because the reference direction chosen for $i_{L1}$ in FIG. 1 (as indicated by the arrow) is opposite what is conventionally chosen for regulating a boost converter using current-mode control; the inverting element corrects for this to attain negative feedback in the $V_2$ regulation loop. The value of proportional gain constant k7 of element 84 determines the gain and bandwidth characteristics of the feedback loop controlling $i_{L1}$. The sawtooth generator 62 along with comparators 64 and 66 comprise a conventional pulse width modulator. When desirable, a triangle generator, which is also a conventional practice, could be used in place of the sawtooth generator 62.

The active filter circuit 18 is similar to a bi-directional DC-DC converter that can operate in either boost or buck modes. In the boost mode, $Q_2$ transistor 26 is thought of as the controlled switch, and $Q_1$ transistor 24 as a synchronous rectifier, and energy is transferred from the power system bus 14 to $C_2$ capacitor 42. In the buck mode, $Q_1$ transistor 24 is thought of as the controlled switch and $Q_2$ transistor 26 as a synchronous rectifier, and energy is transferred from $C_2$ capacitor 42 to the power system bus 14. The active filter 18 differs from a standard boost or buck DC-DC converter in the method of control. Whereas a DC-DC converter is controlled to produce a desired DC output voltage, the active filter is controlled to produce a desired AC current $i_{L1}$ in the $L_1$ inductor 32. The desired current is one which will bring about the cancellation of some undesired current or voltage within the power system. The filter will alternate between boost and buck mode in accordance with the instantaneous sign (positive or negative) of the current $i_{L1}$ being injected through $L_1$ inductor 32.

The active filter 18, moreover, works by independently controlling the AC and DC components d and D of duty cycle d. Ignoring the dead time, we can define duty cycle d, which is a function of time, to be the ratio of the upper switch on-time ($T_{on,Q1}$) to the switching period ($T_s = 1/f_s$):

$$d = T_{on,Q1}/T_s = D + d \qquad (1)$$

where D is the DC or non-time varying component of duty cycle and d is the AC or time varying component of duty cycle.

One can also define a complementary duty cycle d' function in terms of the lower switch Q2 on-time as:

$$d' = 1 - d = T_{on,Q2}/T_s = D' + d' \qquad (2)$$

where, $$D' = 1 - D \qquad (3)$$

and, $$d' = -d \qquad (4)$$

Implicit in the above definitions is the fact that switch on-times can vary as a function of time, i.e., they change from one switching cycle to the next.

The DC component D of duty cycle d is used to control the DC level of the voltage $V_2$ on the $C_2$ capacitor 42. If D is held at a fixed value, or possibly varied very slowly under in response to a low-bandwidth control loop, the active filter 18 acts like a conventional DC-DC boost converter, with the upper switch $Q_1$ transistor 24 laying the role usually performed by a rectifier diode, except that in this case it acts as synchronous rectifier, and the lower switch $Q_2$ transistor 26 playing the more usual role of the actively controlled switching device. Applying the well known steady-state duty cycle equation for boost converters gives:

$$V_2 = [1/(1-D')]V_1 \qquad (5)$$

In terms of D, equation (5) becomes simply:

$$V_2 = V_1/D \qquad (6)$$

Once a DC voltage has been established on $C_2$ capacitor 42, it acts as a reservoir of energy that can be used to generate the time varying currents needed for the cancellation of ripple in the power system. As Q1 transistor 24 and Q2 transistor 26 switch, the voltage $v_3$ at their midpoint (node 34) jumps between 0 and $v_2$. However, the switching frequency $f_s$ is chosen to be large compared to the frequency components of the ripple cancellation current being injected. Also, $L_1$ inductor 32 and $C_1$ capacitor 38 are chosen so as to filter the switching frequency components sufficiently that they do not adversely affect the power system. Under these conditions, one can analyze the circuit behavior in terms of the average voltage at the node 34 between Q1 and Q2. Applying averaging, the voltage $v_3$ at node 34 is:

$$v_3 = v_2 d \qquad (7)$$

Note that $v_3$ is still a function of time, only the high frequency switching components have been averaged out; components at the ripple cancellation frequencies and below remain. Using equation (7), the voltage current relation for the $L_1$ is:

$$d/dt(i_{L1}) = (v_2 d - v_1)/L_1 \qquad (8)$$

The DC and AC terms of equation (8) can be separated to produce two equations. The DC equation simply reduces to equation (6). The AC equation is:

$$d/dt(i_{L1}) = (V_2 d + v_2 d + v_2 D - v_1)_1 \qquad (9)$$

In many systems, the value of $C_2$ capacitor 42 is chosen to be large enough so that the AC component $v_2$ of $v_2$ as shown in FIG. 4 is small compared to the DC component $V_2$. The AC $v_1$ component of $v_1$ is typically small as well. In such systems, $V_2 d$ is the dominant term in the numerator of equation (9) which can be reduced to:

$$d \approx L_1 d/dt(i_{L1})/V_2 \qquad (10)$$

Thus, injection of some arbitrary AC current waveform $i_{L1}$ into the power system can be accomplished by controlling the AC component d of duty cycle d in accordance with equation (10).

In the present invention, the duty cycle signal d is generated for many applications as an error signal as part of a closed loop control system (FIG. 2). Even in cases where an approximation of equation (10) does not strictly hold, such a control system would be able to generate a suitable function d that will produce the desired injection current $i_{L1}$ through the $L_1$ inductor 32. This ability would be constrained, of course, by the usual dynamic range, frequency response, and stability limitations that are typical of such a system.

In such an instance, if a more exact solution for d is desired, one can be found by introducing a few additional equations. Equation (9) cannot be solved explicitly for d because the AC component of $v_2$, i.e., $v_2$, depends on d. Accordingly, applying averaging as before, the current through Q1 transistor 24 and its D1 diode 28 is:

$$i_{Q1} = d i_{L1} \qquad (11)$$

Using equation (11), the voltage-current relation for $C_2$ capacitor 42 is:

$$-d i_{L1} = C_2 d/dt(v_2) \qquad (12)$$

The DC and AC terms of (12) can be separated to produce two equations. The DC equation reduces to:

$$I_{L1} = 0 \qquad (13)$$

This indicates that the DC component of current in $L_1$ is zero. This result comes about because in deriving the above equations an idealized assumption is made, that there are no losses in the active filter 18. In a real implementation, however, there would be losses in the active filter, and a non-zero DC current would have to flow in order to draw power from the DC power system and replenish those losses. This is represented by the slight negative DC offset in the waveform for $i_{L1}$ shown in FIG. 3.

The AC equation derived from (12) is:

$$d/dt(v_2) = -(Di_{L1} + dI_{L1} + di_{L1})/C_2 \quad (14)$$

Equation (14) together with equation (9) and the equations describing the DC power system can be solved simultaneously to find a control function d that will produce a desired injection current $i_{L1}$.

As stated above, the active filter 18 is capable of generating an arbitrary AC current waveform that can be used to cancel unwanted signals within the power system. There are two primary modes of application:

1) Cancellation of Unwanted Voltage Ripple at the Load(s)

Referring to FIG. 1 and summing the AC currents entering and leaving the DC power bus 14 results in:

$$i_s + i_{L1} - i_0 - i_{C1} = 0 \quad (15)$$

If $i_{L1}$ is controlled such that $i_{L1} = -i_s + i_o$, equation (15) reduces to $i_{C1} = 0$. With no AC ripple current flowing through $C_1$ capacitor 38, the ripple voltage on $C_1$ and hence at the load(s) 12, will also be zero.

Selective cancellation is also possible. If one makes $i_{L1} = -i_s$, the component of ripple voltage at the load(s) 12 due to source disturbances will be canceled. If the load(s) 12 are passive, $i_0$ will also be made zero and no further ripple cancellation should be needed. This is the mode of application employed in the control circuit embodiment illustrated by the control diagram shown in FIG. 2. If one makes $i_{L1=i0}$, the component of ripple voltage at the load(s) 12 due to load disturbances will be canceled.

2) Cancellation of Unwanted Current Ripple Drawn from the Source

Referring again to equation (15), if $i_{L1}$ is controlled such that $i_{L1=i0} + i_{C1}$, equation (15) reduces to $i_s = 0$, which is the desired result. No AC current flowing through the source impedance $Z_s$ requires that $v_1 = v_s$. So the desired value for $i_{L1}$ can be specified more precisely as $i_{L1} = i_0 + C_1 d/dt(v_s)$.

Once again, selective cancellation is possible. If one makes $i_{L1} = i_0$, the component of input current ripple due to load disturbances will be canceled, leaving only the component due to source disturbances. In some applications, this may be all that is required.

Having thus shown and described what is at present considered to be the preferred embodiment of this invention, it should be noted that the foregoing detailed description merely illustrates the principles of the invention. It will thus be appreciated that those skilled in the art will be able to devise various arrangements which, although not explicitly described or shown herein, embody the principles of the invention and are thus within its spirit and scope. For example, the semiconductor power switches $Q_1$ and $Q_2$ may, when desirable, be comprised of but not limited to metal oxide field effect transistors (MOSFETs), bipolar junction transistors (BJTs), metal oxide controlled thyristors (MCTs), and gate turn-off thyristors (GTOs).

What is claimed is:

1. An active filter for controlling ripple in the load current or source current of a DC power system, comprising:

an electrical power bus system including a power bus and a return bus connected between a DC source and a load;

a power circuit including, a capacitor for storing electrical energy; a pair of series connected switching elements and respective anti-parallel diodes connected in parallel with the capacitor, one of said switching elements being connected to the return bus; and an electrical inductance element being connected from a common connection between the switching elements to the power bus; and, a control circuit responsive to a current signal corresponding to the current fed from the DC source to the load, a voltage signal corresponding to the voltage across the load, a voltage signal corresponding to the voltage across the capacitor, and a current signal corresponding to the current flowing through inductance element, the control circuit generating first and second complementary pulse width modulated control signals for respectively controlling the operating states of the switching elements so as to have mutually opposite switch states for modulating the current drawn from or supplied to the DC source so as to cancel undesired currents and voltages within the power system.

2. An active filter according to claim 1 wherein said switch elements are comprised of semiconductor switch devices.

3. An active filter according to claim 2 wherein said semiconductor switch devices are comprised of transistors.

4. An active filter according to claim 1 wherein said diodes are comprised of semiconductor devices.

5. An active filter according to claim 1 and additionally including another capacitor connected across the power bus and the return bus for providing high frequency filtering.

6. An active filter according to claim 1 and additionally including a current sensor located at the power bus for providing the current signal corresponding to the current fed from the DC source to the load.

7. An active filter according to claim 1 and additionally including a current sensor located at the inductance element for providing the current signal corresponding to the current flowing in the inductance element.

8. An active filter according to claim 1 wherein the switching elements are switched at a constant frequency.

9. An active filter according to claim 8 wherein the pulse width modulated control signals operate to vary the duty cycle of the switching elements so as to generate an arbitrarily shaped AC current waveform in the inductance element which is fed into the power bus to cancel the undesired current and voltages.

10. An active filter according to claim 9 wherein the control circuit controls the switching elements so as to operate in boost and buck modes where one of said pair of switch elements effectively operates as a controlled switch and the other of said pair of switch elements effectively operates as a synchronous rectifier, and wherein energy is transferred from the power bus to the capacitor in the boost mode and wherein energy is transferred from the capacitor to the power bus in the buck mode.

11. An active filter according to claim 10 wherein the pair of switching elements comprises an upper switching element and a lower switching element, the lower switching element being connected to the return bus and one side of the capacitor, the upper switching element being connected to the other side of the capacitor, and wherein in the boost mode the lower switching element effectively operates as the controlled switch and the upper switching element effectively operates as the synchronous rectifier, and wherein in the buck mode the lower switching element effectively operates as the synchronous rectifier and the upper switching element effectively operates as the controlled switch.

12. An active filter according to claim 11 wherein said switching elements are comprised of semiconductor switch devices.

13. An active filter according to claim 12 wherein said semiconductor switch devices are comprised of transistors.

14. An active filter according to claim 11 wherein said diodes are comprised of semiconductor devices.

15. A method of controlling ripple in the load current or source current of a DC power system, comprising the steps of:

connecting an active filter including a power circuit and a control circuit to a DC power system including a power bus and a return bus connected between a DC source and a load;

the power circuit including, a capacitor for storing electrical energy; a pair of series connected switching elements and respective anti-parallel diodes connected in parallel with the capacitor, one of said switching elements being connected to the return bus; and an electrical inductance element being connected from a common connection between the switching elements to the power bus;

generating a current signal corresponding to the current fed from the DC source to the load;

generating a voltage signal corresponding to the voltage across the load;

generating a voltage signal corresponding to the voltage across the capacitor;

generating a current signal corresponding to the current flowing through inductance element;

generating first and second complementary pulse width modulated control signals by the control circuit in response to said current and voltage signals;

applying said control signals to the switching elements for respectively controlling the operating states of the switching elements so as to have mutually opposite switch states; and modulating current drawn from or supplied to the DC source so as to cancel undesired currents and voltages within the power system.

16. The method according to claim 15 wherein said switching elements are comprised of semiconductor switch devices.

17. The method according to claim 16 wherein the semiconductor switch devices are comprised of transistors.

18. The method according to claim 15 wherein said diodes are comprised of semiconductor devices.

* * * * *